United States Patent
Fujii et al.

(10) Patent No.: US 6,889,426 B2
(45) Date of Patent: May 10, 2005

(54) METHOD FOR MANUFACTURING WIRED CIRCUIT BOARD

(75) Inventors: Hirofumi Fujii, Osaka (JP); Shunichi Hayashi, Osaka (JP)

(73) Assignee: Nitto Denko Corporation, Osaka (JP)

(*) Notice: Subject to any disclaimer, the term of this patent is extended or adjusted under 35 U.S.C. 154(b) by 271 days.

(21) Appl. No.: 10/198,121

(22) Filed: Jul. 19, 2002

(65) Prior Publication Data

US 2003/0024110 A1 Feb. 6, 2003

(30) Foreign Application Priority Data

Jul. 25, 2001 (JP) ........................................ 2001-223747

(51) Int. Cl.[7] .............................................. H01R 43/00
(52) U.S. Cl. .......................... 29/825; 29/605; 29/829; 29/831; 29/848; 29/851; 29/855; 29/858; 156/184; 156/289; 361/742; 361/804; 174/254; 427/96
(58) Field of Search .......................... 29/825, 831, 848, 29/851, 855, 858, 605, 829; 361/742, 804; 174/254; 427/96; 156/184, 289

(56) References Cited

U.S. PATENT DOCUMENTS

| | | | | |
|---|---|---|---|---|
| 3,939,449 A | * | 2/1976 | Boyd et al. | 336/60 |
| 4,173,747 A | * | 11/1979 | Grimes et al. | 336/60 |
| 4,874,648 A | * | 10/1989 | Hill et al. | 428/35.9 |
| 5,460,858 A | * | 10/1995 | Yamada et al. | 427/510 |
| 5,780,131 A | * | 7/1998 | Paasonen et al. | 428/35.9 |

FOREIGN PATENT DOCUMENTS

JP 01307250 A * 12/1989 ........... H01L/23/28

OTHER PUBLICATIONS

"Novel thermally reworkable underfill encapsulants for flip-chip applications"; Wang, L.; Wong, C.P.; Advanced Packaging, IEE Transactions on vol.: 22, Issue: 1, Feb. 1999; pp.:46–53.*

* cited by examiner

*Primary Examiner*—A. Dexter Tugbang
*Assistant Examiner*—Paul D Kim
(74) *Attorney, Agent, or Firm*—Jean C. Edwards; Dickinson Wright PLLC

(57) ABSTRACT

A method for manufacturing wired circuit board that enables a wired circuit board of high quality to be manufactured without changing in dimension of the wired circuit board substantially. In this method, the wired circuit board is wound in layers in the winding process in such a manner that after an uncured thermosetting resin layer is formed on the wired circuit board in the resin layer forming process, a right-side spacer and a left-side spacer are disposed on the already wound wired circuit board at both widthwise ends thereof and also an upper spacer is disposed on the right-side spacer and the left-side spacer so as to cover a widthwise area of the wired circuit board, so that the right-side spacer, the left-side spacer and the upper spacer are positioned between the layers of the wired circuit board when wound. Thereafter, the wired circuit board wound in the rolled state is heated as it is, to cure the uncured thermosetting resin layer in the curing process.

1 Claim, 5 Drawing Sheets

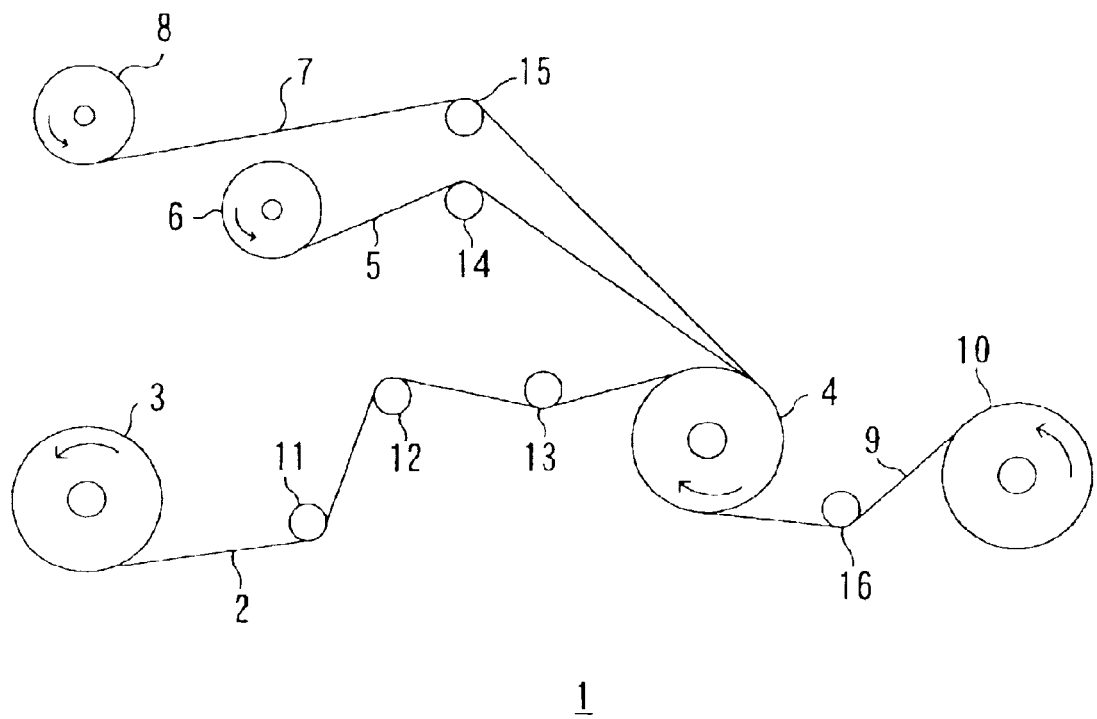
F I G. 1

METHOD FOR MANUFACTURING WIRED CIRCUIT BOARD

The present invention claims priority from Japanese Patent Application Ser. No. 2001-223747, filed Jul. 25, 2001, which is herein incorporated by reference.

BACKGROUND OF THE INVENTION

1. Field of the Invention

The present invention relates to a method for manufacturing a wired circuit board and, more particularly, to a method for manufacturing a wired circuit board comprising the step for forming a coverlay on a wired circuit board formed in an elongated film form.

2. Description of the Prior Art

Generally, wired circuit boards, including a flexible wired circuit board, each comprises a specified wired circuit pattern of a metal foil formed on an insulating film and a coverlay of resin formed on the wired circuit pattern to cover it.

In the manufacturing method of a wired circuit board, the coverlay is generally formed, for example, by solution of thermosetting resin being continuously applied to a specified wired circuit pattern formed on the insulating film of an elongate wired circuit board, first, and then dried, or by an uncured thermosetting resin film being continuously laminated on the specified wired circuit pattern and then the uncured thermosetting resin being cured.

The curing of the thermosetting resin requires a heat treatment. The heat treatment is generally carried out by using feed rolls, a winding roll and a heating furnace provided between the feed rolls and the winding roll. The thermosetting resin on the wired circuit board is heated to be cured by the heating furnace by the time the wired circuit board, after fed from the feed roll, is wound up by the winding roll.

This conventional method involves the problem that since tension is exerted on the wired circuit board when wound up by the winding roll and also elasticity modulus of the insulating film forming the wired circuit board is reduced by heat, the insulating film is increased in length and is changed in dimension. This dimensional change significantly affects on fine pitch of the wired circuit board which has been increasingly demanded in recent years.

To prevent this problem, it is conceivable, for example, that the wired circuit board is heated in its rolled state. However, since the uncured thermosetting resin usually softens and flows when heated, there is the possibility that when heated, the uncured thermosetting resin may contact with the wired circuit board which is wound over it. If this is the case, the pattern on the wired circuit board may be transferred to the contact surface to impair the formation of the coverlay formed.

SUMMARY OF THE INVENTION

It is the object of the invention to provide a new method for manufacturing a wired circuit board that enables a wired circuit board of high quality to be manufactured without changing the dimension of the wired circuit board substantially.

The present invention provides a method for manufacturing a wired circuit board comprising the resin layer forming step of forming an uncured thermosetting resin layer on the wired circuit board having a specified wired circuit pattern formed on an elongate insulating film; the winding step of winding in layers the wired circuit board forming thereon the uncured thermosetting resin layer; and the curing step of curing the uncured thermosetting resin layer by heating the wired circuit board wound in its rolled state, wherein in the winding step, first spacers are disposed on the wired circuit board at both widthwise ends thereof and a second spacer is disposed on the first spacers to extend between the first spacers so as to cover a widthwise area of the wired circuit board in such a manner that the first spacers and the second spacer are positioned between the layers of the wired circuit board when wound.

According to this method, since the wired circuit board is heated in its rolled state, the rolled wired circuit board is prevented from being continuously tensioned when heated. In addition, since the first spacers are disposed on both widthwise ends of the wired circuit board and the second spacer is disposed on the first spacers disposed at the both sides of the wired circuit board to cover a widthwise area of the wired circuit board in such a manner that the first spacers and the second spacer are positioned between the layers of the wired circuit board wound, the uncured thermosetting resin can be prevented from contacting with and adhering to the wired circuit board wound over the uncured thermosetting resin layer. Further, since the wired circuit board wound is fixed in place on the second spacer under tension, the wired circuit board is prevented from being wrinkled or being stressed locally.

Thus, according to the method for manufacturing a wired circuit board of the present invention, the wired circuit board of quality can be manufactured without causing dimensional change of the wired circuit board and without causing impairment of the thermosetting resin layer. As a result of this, a wired circuit board with a wired circuit pattern of fine pitch formed thereon, which is being increasingly demanded in recent years, can be manufactured with a high quality.

BRIEF DESCRIPTION OF THE DRAWINGS

FIG. 1 schematically shows one embodiment of a wired circuit board manufacturing apparatus to which a method for manufacturing a wired circuit board of the present invention is applied;

DETAILED DESCRIPTION OF THE PREFERRED EMBODIMENTS

Figure 2:
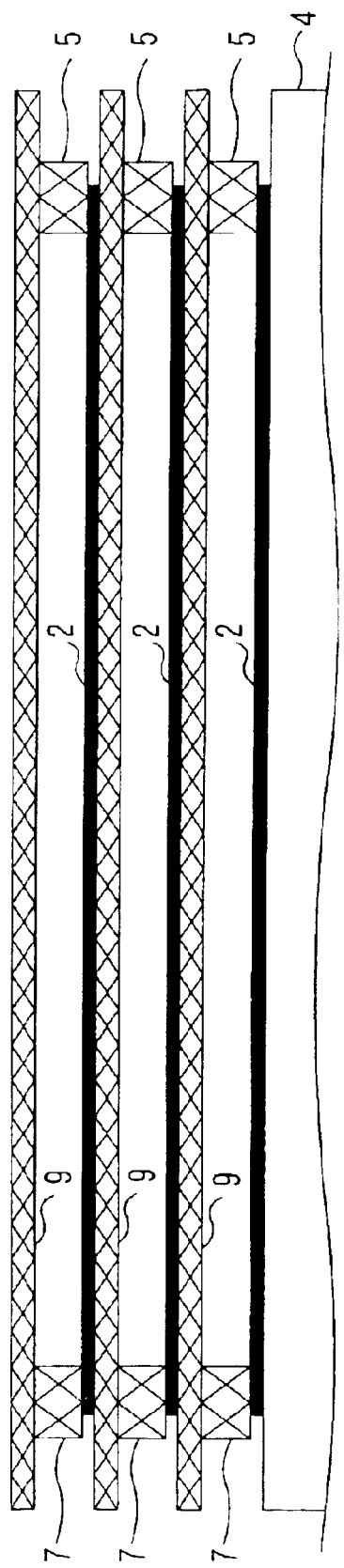
FIG. 2 shows in section a principal part of the wired circuit board wound up on a winding roll of the wired circuit board manufacturing apparatus shown in FIG. 1.

FIG. 1 schematically shows one embodiment of a wired circuit board manufacturing apparatus to which a method for manufacturing a wired circuit board of the present invention is applied. In the following, a practical example of the method for manufacturing wired circuit board of the present invention will be described with reference to a wired circuit board manufacturing apparatus shown in FIG. 1.

In FIG. 1, the wired circuit board manufacturing apparatus 1 is used in the step of the method of manufacturing the wired circuit board, for forming a coverlay as a thermosetting resin layer on the wired circuit board. The wired circuit board manufacturing apparatus 1 comprises a feed roll 3 around which an elongate wired circuit board 2 is wound, a winding roll 4 for winding up the elongate wired circuit board 2, a right-side spacer feed roll 6 around which a right-side spacer 5 as a first spacer is wound, a left-side spacer feed roll 8 around which a left-side spacer 7 also as the first spacer is wound, and an upper spacer feed roll 10 around which an upper spacer 9 as a second spacer is wound. Three guide rolls 11, 12 and 13 are provided between the feed roll 3 and the winding roll 4. One guide roll 14 is provided between the right-side spacer feed roll 6 and the winding roll 4. One guide roll 15 is provided between the left-side spacer feed roll 8 and the winding roll 4. One guide roll 16 is provided between the upper spacer feed roll 10 and the winding roll 4.

Figure 3:
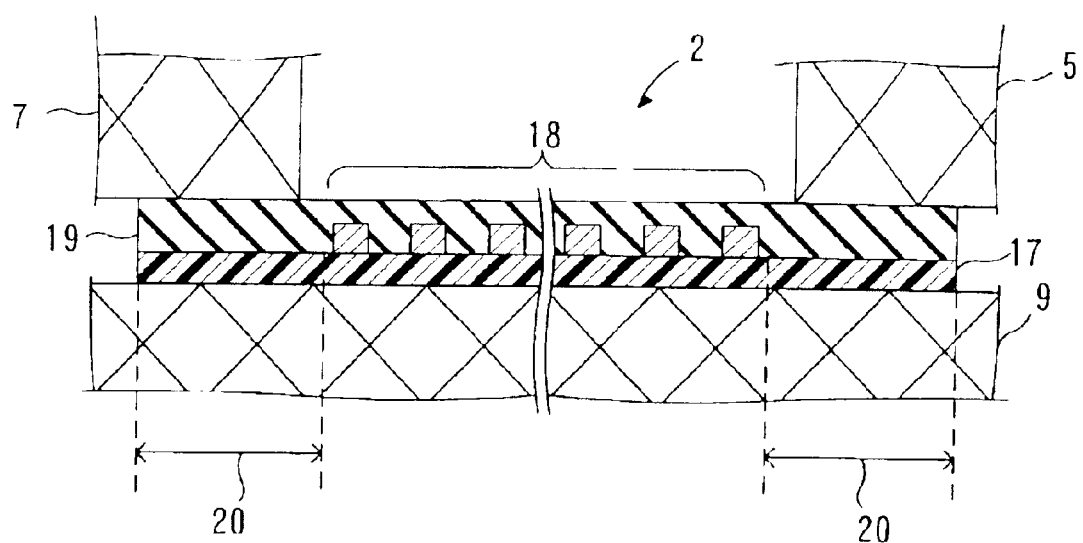
FIG. 3 is an enlarged sectional view of the principal part of FIG. 2.

The wired circuit board 2 on which an uncured thermosetting resin layer 19 (Cf. FIG. 3) is laminated to continuously extend is wound around the feed roll 3, as mentioned later.

The winding roll 4 is disposed downstream from the feeding direction of the feed roll 3 via the guide rolls 11, 12 and 13. The winding roll 4 is so constructed that the wired circuit board 2 fed from the feed roll 3, the right-side spacer 5 fed from the right-side spacer feed roll 6, the left-side spacer 7 fed from the left-side spacer feed roll 8, and the upper spacer 9 fed from the upper spacer feed roll 10 can be sequentially wound up along the rotation direction of the winding roll 4.

The right-side spacer feed roll 6 and the left-side spacer feed roll 8 are disposed above the winding roll 4, respectively. The right-side spacer feed roll 6 is so constructed as to feed the right-side spacer 5 therefrom toward the winding roll 4 via the guide roll 14, and the left-side spacer feed roll 8 is so constructed as to feed the left-side spacer 7 therefrom toward the winding roll 4 via the guide roll 15.

The upper spacer feed roll 10 is disposed below the winding roll 4 and is so constructed as to feed the upper spacer 9 therefrom toward the winding roll 4 via the guide roll 16.

In this method, the uncured thermosetting resin layer 19 is formed on the wired circuit board 2, first, in the resin layer forming step.

The wired circuit board 2 has a specified wired circuit pattern 18 (Cf. FIG. 3) formed on an elongate insulating film 17 (Cf. FIG. 3). Though no particular limitation is imposed on the insulating film 17, the materials that may be used for the insulating film 17 include, for example, synthetic resins, such as polyimide resin, acrylic resin, polyether nitrile resin, polyether sulfonic resin, polyester resin, polyethylene naphthalate resin and polyvinyl chloride resin. The insulating film 17 is formed in the form of an elongate film having, for example, a width in the range of 100–500 mm and a thickness in the range of 5–50 $\mu$m. When the insulating film is too thin, there is the possibility that the film may be broken by the tension exerted thereon when wound up in the winding step as mentioned next. Of these insulating films 17, an elongate polyimide film is preferably used.

The specified wired circuit pattern 18 has a pattern of a metal foil. Though no particular limitation is imposed on the specified wired circuit pattern 18, the metal foils that may be used for the wired circuit pattern include, for example, copper, chromium, nickel, aluminum, stainless, copper—beryllium, phosphor bronze, iron-nickel and alloys thereof The specified wired circuit pattern 18 is formed on the insulating film 17 by a known patterning process, such as a subtractive process, an additive process and a semi-additive process. Preferably, the wired circuit pattern 18 is formed in the form of a pattern of copper foil.

Though no particular limitation is imposed on the wired circuit pattern 18, the wired circuit pattern 18 is formed on the elongate insulating film 17 to extend continuously and is in the form of a line pattern of fine pitch having a thickness of 5–50 $\mu$m, for example. To be more specific, the wired circuit pattern 18 is formed to have the line width/space width in the range of 50 $\mu$m/50 $\mu$m to 150 $\mu$m/150 $\mu$m, for example. It is to be noted that when the thickness of the wired circuit pattern 18 is in excess of 50 $\mu$m, sufficient flexibility cannot be provided for the wired circuit board 2, and as such may make it hard to wind up the wired circuit board 2 in the winding step mentioned next.

The wired circuit pattern 18 may have not only this line pattern but also an opening terminal portion to connect with various types of terminals. If such an opening terminal portion is formed in a circle, it preferably has a diameter in the range of 150–450 $\mu$m.

To be more specific, the elongate wired circuit board 2 can be produced, for example, in the process that a two-layer substrate is prepared by laminating a metal foil on the entire area of the elongate insulating film 17 through an adhesive layer, if necessary, first, and then the metal foil of the two-layer substrate is formed into the specified wired circuit pattern 18 in the subtractive process.

Preferably, the wired circuit board 2 includes, in addition to its product part which comes to be subsequently used as finished products, margins 20 formed at both widthwise ends thereof at which the right-side spacer 5 and the left-side spacer 7 which are wound together with the wired circuit board 2 in the next process are disposed, respectively, as shown in FIG. 3. The provision of the margins 20 enables the right-side spacer 5 and the left-side spacer 7 to be prevented from being overlapped with the product part of the wired circuit board 2, and as such can effectively prevent causing impairment of the product part of the wire circuit board 2. Preferably, the margins 20 are formed to have a width of e.g. approximately 5 mm from the side edge of the wired circuit board 2.

In the resin layer forming process, the uncured thermosetting resin layer 19 is formed on the wired circuit board 2 thus formed.

Though no particular limitation is imposed on the uncured thermosetting resin, for example precursors of the above mentioned synthetic resins are preferably used. Preferably, polyamic acid resin which is a precursor of polyimide resin is used. The polyamic acid resin can be prepared as solution of polyamic acid resin, for example, by allowing organic tetracarboxylic dianhydride and diamine to react with each other in a proper organic solvent, such as an organic polar solvent, such as N-methyl-2-pyrrolidone, N,N-dimethyl acetamide, N,N-dimethyl formamide, dimethyl sulfoxide, and hexamethyl phospholamide, in such a proportion as to substantially establish an equimole ratio.

The uncured thermosetting resin layer 19 can be formed on the wired circuit board 2, for example, by solution of uncured thermosetting resin, such as solution of polyamic acid resin mentioned above, being continuously applied to the wired circuit pattern 18 of the wired circuit board 2 and then being dried. No particular limitation is imposed on the application method. For example, the doctor blade method, the comma coating method, the fountain coat method, the curtain coat method and other known methods may be used. Also, when e.g. solution of polyamic acid resin applied to the wired circuit pattern is dried, it may be dried by heating at a temperature in the range of 70–130° C., though it depends on the type of resin and solvent used.

When the uncured thermosetting resin layer 19 is formed of polyamic acid resin, a known photosensitive agent may be mixed in the polyamic acid resin to photosensitive the polyamic acid resin before the uncured thermosetting resin layer 19 is formed. Then, the uncured thermosetting resin layer 19 is exposed to light and developed via a photoresist and the like, so as to be patterned into a specified pattern in which the opening terminal portion is formed.

The uncured thermosetting resin layer 19 may be formed on the wired circuit board 2 in another method. For example, the method in which after the uncured thermosetting resin is melted to the extent to which the curing is not completed, the thermosetting resin thus melted is laminated on the wired circuit board 2; and the method in which after the uncured thermosetting resin layer 19 is formed on another supporting member able to be peeled, that uncured thermosetting resin layer 19 is transferred on to the wired circuit board 2 may be used to form the uncured thermosetting resin layer 19 on the wired circuit board 2.

Preferably, the uncured thermosetting resin layer 19 thus formed has a thickness in the range of 5–100 μm, or preferably 10–50 μm.

Sequentially, in this method, the wired circuit board 2 on which the uncured thermosetting resin layer 19 is formed is wound in the winding process.

The winding of the wired circuit board 2 is carried out by using the wired circuit board manufacturing apparatus 1. To be more specific, the wired circuit board 2 is wound in layers by the wired circuit board manufacturing apparatus 1 in such a manner that the right-side spacer 5 and the left-side spacer 7 are disposed on the wired circuit board 2 at both widthwise ends thereof and the upper spacer 9 to cover the widthwise area of the wired circuit board 2 is disposed on the right-side spacer 5 and the left-side spacer 7 to extend therebetween so that the right-side spacer 5, the left-side spacer 7 and the upper spacer 9 are positioned between the layers of the wired circuit board 2 to be wound.

Specifically, in the wired circuit board manufacturing apparatus 1, the wired circuit board 2 forming thereon the uncured thermosetting resin layer 19 is previously wound around the feed roll 3. When the wired circuit board 2 wound around the feed roll 3 is wound up by the winding roll 4, the right-side spacer 5 fed from the right-side spacer feed roll 6 and the left-side spacer 7 fed from the left-side spacer feed roll 8 are simultaneously wound on the wired circuit board 2 at both widthwise ends thereof, first, and, then, the upper spacer 9 fed from the upper spacer feed roll 10 is wound on the right-side spacer 5 and the left-side spacer 7 by the time the next wired circuit board 2 is wound on the wired circuit board 2 that is presently wound around the winding roll 4.

As a result of this winding, the right-side spacer 5 and the left-side spacer 7 are disposed on the wired circuit board 2 at both widthwise ends thereof and the upper spacer 9 to cover the widthwise area of the wired circuit board 2 is disposed on the right-side spacer 5 and the left-side spacer 7 to extend therebetween in such a manner that the right-side spacer 5, the left-side spacer 7 and the upper spacer 9 are positioned between the layers of the wired circuit board 2 when wound, as shown in FIG. 2.

In this winding process, the diameter of the winding roll 4 should preferably be in the range of 5–30 cm. When the diameter of the winding roll 4 is too small, the wired circuit board 2 when wound may have an inclination to be curled.

The right-side spacer 5 and the left-side spacer 7 are preferably made of material that can be formed into an elongate tape form and is hardly deformed and melted at all by heating, such as the material having a coefficient of linear expansion of not more than 20 ppm or the material having a melting point of not less than 500° C. Preferably, the spacers 5, 7 each have a width in the range of 10–30 mm. When the spacers 5, 7 are too narrow, there is the possibility that the right-side spacers 5 or the left-side spacers 7 may not be overlapped with each other with respect to the winding direction (the vertical direction as viewed in FIG. 2), and as such may cause the wired circuit board 2 to be off-balance due to the tension at winding. On the other hand, when the spacers 5, 7 are too large, the wired circuit board 2 requires extra margins 20 for the right-side spacer 5 and the left-side spacer 7 to be sandwiched between the layers of the wired circuit board 2 when wound, then resulting in increase of material cost. If the wired circuit board 2 is not provided with these extra margins, then the right-side spacer 5 and the left-side spacer 7 will be overlapped with the product part of the wired circuit board 2, and as such may cause impairment of the product part.

Though no particular limitation is imposed on the right-side spacer 5 and the left-side spacer 7, these spacers 5, 7 are preferably formed from a metal mesh, or particularly a stainless mesh, having thickness of 0.5–2 mm.

A plain-woven metal mesh with square holes formed from wire of diameter of e.g. 0.1–1 mm is preferably used as the metal mesh for the spacers 5, 7. Preferably, a side of the square hole is in the range of 0.1–2 mm in size. Also, the mesh size (the number of holes per inch (2, 54 cm)) is preferably in the range of 10–100.

As the result of the right-side spacer 5 and the left-side spacer 7 being formed from the metal mesh, the gas generated at the curing of the uncured thermosetting resin layer 19 can well be purged from the holes or apertures of the woven mesh. When the size of the hole or aperture of the woven mesh is smaller than the mesh size mentioned above, there is the possibility that the gas may be poorly purged.

The upper spacer 9 is preferably made of material that can be formed into a sheet form and is hardly deformed and melted at all by heating, such as the material having a coefficient of linear expansion of not more than 20 ppm or the material having a melting point of not less than 500° C. Preferably, the spacer 9 has a width equal to or more than the width of the wired circuit board 2. For example, the spacer 9 preferably has a width of 100–600 mm. Though the upper spacer 9 may be formed from the metal foil such as stainless foil, it is preferably formed from the metal mesh, or particularly stainless mesh, as is the case with the right-side spacer 5 and the left-side spacer 7. Preferably, the upper spacer 9 formed from the metal mesh preferably has thickness of e.g. 0.1–1 mm, and the upper spacer 9 formed from the metal foil has thickness of e.g. 20–100 μm.

A plain-woven metal mesh with square holes formed from wire of diameter of e.g. 0.02–1 mm is preferably used as the metal mesh for the upper spacer 9. Preferably, a side of the square hole is in the range of 0.02–1 mm in size. Also, the mesh size (the number of holes per inch (2.54 cm)) is preferably in the range of 10–500. When the size of the hole or aperture of the woven mesh is larger than the mesh size mentioned above, there is the possibility that the patterned indented surface of the upper spacer 9 formed from the metal mesh may be marked on the insulating film 17 of the wired circuit board 2.

As shown in FIG. 2, the right-side spacer 5, the left-side spacer 7 and the upper spacer 9 are wound sequentially so as to be positioned between the layers of the wired circuit board 2 when wound in such a condition that the right-side spacer 5 and the left-side spacer 7 are placed opposite in parallel with each other on the already-wound wired circuit board 2 at both widthwise ends thereof (or in its margins 20, if formed, as shown in FIG. 3); the upper spacer 9 is placed on the right-side spacer 5 and the left-side spacer 7 to cover the entire widthwise area of the wired circuit board 2; and the wired circuit board 2 to be wound next is placed on the upper spacer 9.

When the right-side spacer 5 and the left-side spacer 7 are placed on the wired circuit board 2 at both widthwise ends thereof in this manner, they are preferably placed to be off from the edge of the wired circuit board 2 to the widthwise outward side, respectively, as shown in FIG. 2. The placement of the right-side spacer 5 and the left-side spacer 7 to be off from the edge of the wired circuit board 2 can provide the advantage of facilitating the visual inspection of the proper positions of the right-side spacer 5 and the left-side spacer 7 wound, to easily make the inspection, for example, on whether the spacers 5, 7 are off from the edge of the wired circuit board 2 to the widthwise inside of the same to an excessive extent to which they are overlapped with the product part of the wired circuit board 2.

When the right-side spacer 5 and the left-side spacer 7 are placed to be off from the edge of the wired circuit board 2 as mentioned above, those spacers 5, 7 are preferably off therefrom, for example, by about one-third to about two-third of the widthwise lengths of the right-side spacer 5 and the left-side spacer 7.

In this method, the wired circuit board 2 wound in the condition mentioned above in the winding process is heated in its rolled state in the curing process to cure the uncured thermosetting resin layer 19.

The uncured thermosetting resin layer 19 can be cured by heating the winding roll 4 around which the wired circuit board 2 is wound, for example, at temperature in the range of 200–450° C. in vacuum by using an additional heating machine. As a result of this, the uncured thermosetting resin layer 19 is cured and the coverlay to cover the wired circuit pattern 18 of the wired circuit board 2 is formed. Thus, the wired circuit board 2 covered with the coverlay is produced.

According to this method, since the upper spacer 9 covers the entire widthwise and lengthwise areas of the wired circuit board 2 and also supports the wired circuit board 2 wound or fix it in place on the upper spacer 9 under tension, the wired circuit board 2 can be prevented from being tensioned when wound up by the winding roll 4. This can provide the advantages of preventing the insulating film 17 from being increased in length by that tension, of preventing the wired circuit board 2 from being wrinkled, and of preventing generation of local stress. In addition to this, since the right-side spacer 5 and the left-side spacer 7 serve to form a certain space between the layers of the wired circuit board 2 to be wound, the uncured thermosetting resin layer 19 can be effectively prevented from adhering to the upper spacer 9 placed over the uncured thermosetting resin layer 19 to cover it.

Also, in this method, since the wired circuit board 2 is heated in the rolled state in the curing process, the rolled wired circuit board 2 is prevented from being continuously tensioned when heated. In addition, since the right-side spacer 5 and the left-side spacer 7 are interposed between the layers of the wired circuit board 2 when wound, even when the uncured thermosetting resin layer 19 softens and flows by heating, the uncured thermosetting resin layer 19 can be prevented from contacting with and adhering to the upper spacer 9 placed over the uncured thermosetting resin layer 19 to cover it.

Thus, this method enables the uncured thermosetting resin layer 19 to be cured on the wired circuit board 2 in the heat-treatment of the curing process without causing dimensional change of the wired circuit board 2 and without causing impairment of the uncured thermosetting resin layer 19. This enables the wired circuit board 2 covered with the coverlay to be produced with good quality. Consequently, the wired circuit board 2 forming thereon the wired circuit pattern 18 of fine pitch which is being increasingly demanded in recent years can be manufactured with high quality.

Figure 4:
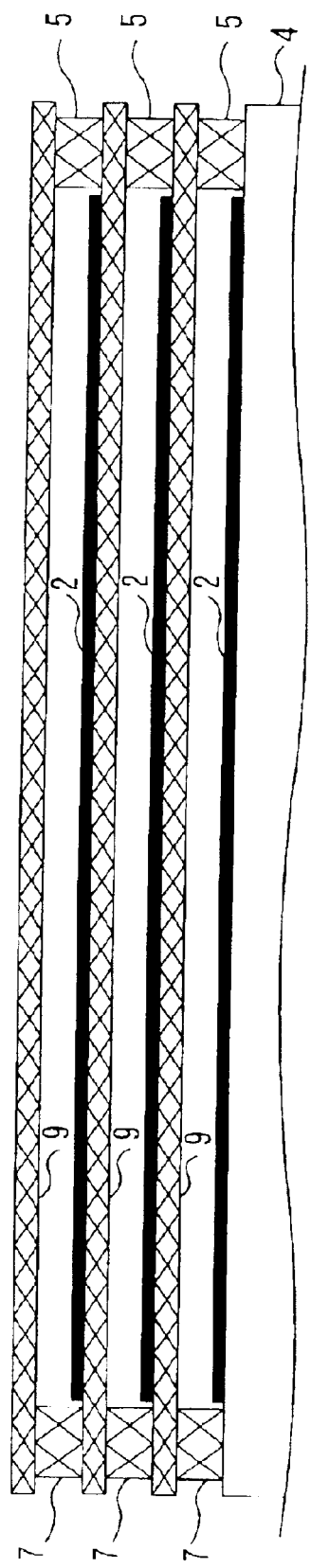
FIG. 4 shows in section a principal part of another embodiment of a wired circuit board wound up on the winding roll of the wired circuit board manufacturing apparatus shown in FIG. 1.

Modification may be made to this method as follows. For example, as shown in FIG. 4, in the winding process, the right-side spacer 5, the left-side spacer 7 and the upper spacer 9 may be wound together with the wired circuit board 2 so as to be positioned between the layers of the wired circuit board 2 which is wound in such a condition that the right-side spacer 5 and the left-side spacer 7 are disposed on the already-wound wired circuit board 2 at both widthwise ends thereof and at the outside of the both widthwise ends, so as to be placed opposite in parallel with each other on the already-wound upper spacer 9 (first roll of spacers are placed on the winding roll 4), and also the upper spacer 9 is disposed on the right-side spacer 5 and left-side spacer 7 in such a manner as to cover the entire widthwise area of the wired circuit board 2. This winding method of the right-side spacer 5, the left-side spacer 7 and the upper spacer 9 can allow the product part to be used to the fullest extent with respect to the widthwise dimension of the wired circuit board 2.

EXAMPLES

While in the following, the present invention will be described in further detail with reference to Example and Comparative Examples, the present invention is not limited to any Examples.

Example 1

The coverlay made of the material given below was formed on the wired circuit board under the conditions given below by using the wired circuit board manufacturing apparatus shown in FIG. 1.

1) Wired circuit board: An elongate two-layer substrate (260 mm in width and 50 m in length) including a copper foil of 18 $\mu$m in thickness laminated directly on a polyimide film of 25 $\mu$m in thickness was prepared, first, and, then, the copper foil of the two-layer substrate thus prepared was patterned as shown in FIG. 5.

Figure 5:
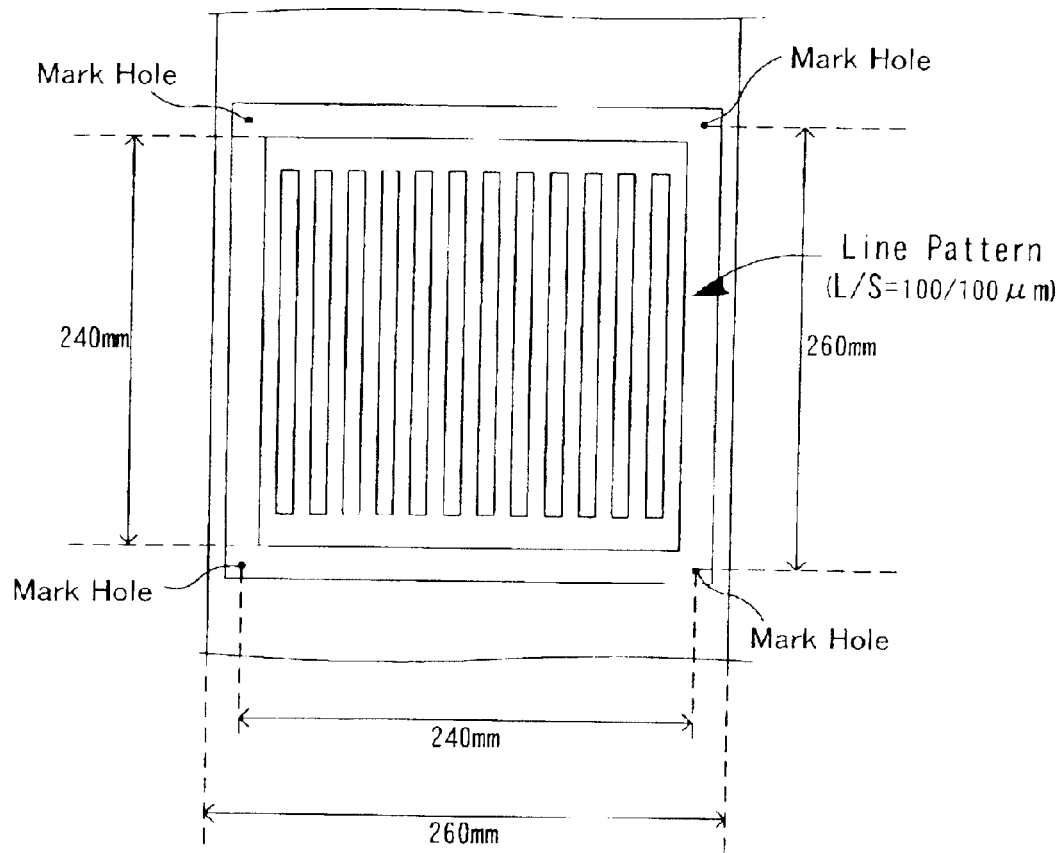
FIG. 5 is a schematic plan view showing a pattern of a copper foil of the wired circuit board used in the Examples.

The pattern was formed in such a manner as shown in FIG. 5 that a line pattern of a 100 $\mu$m in line width/100 $\mu$m in space width (L/S) was formed within a generally square-shaped inner area having a lengthwise dimension of 240 mm along a lengthwise direction thereof and also sizing mark holes were bored at four corners of an outer area of 240 mm (widthwise dimension)×260 mm (lengthwise dimension) surrounding the inner area.

2) Uncured thermosetting resin (Polyamic acid resin): 0.15 mol of 4, 4'-diaminodiphenyl ether and 0.85 mol of p-phenylenediamine per mol of 3,3',4,4'-biphenyl tetra-carboxylic dianhydride were allowed to react with each other in 2,358 g of N-methyl-2-pyrrolidone to prepare a 15 weight % polyamic acid resin solution. The polyamic acid resin solution thus prepared was used.

3) Right-side spacer and left-side spacer: An elongate plain-woven stainless mesh tape (14 mesh, 0.4 mm in wire diameter, and 1.4 mm in side of square hole) having thickness of 0.8 mm and width of 15 mm was used.
4) Upper spacer: An elongate plain-woven stainless mesh sheet (60 mesh, 0.12 mm in wire diameter, and 0.3 mm in side of square hole) having thickness of 0.24 mm and width of 300 mm was used.
5) Method of forming the coverlay:

The polyamic acid resin solution mentioned above was continuously applied to the pattern of wired circuit board at a rate of 0.2 m per minute with a comma coater and was dried as it was in a drying furnace of 100° C. having a length of 2.2 m, whereby the polyamic acid resin layer having thickness of 25 μm after dried was formed. Then, the wired circuit board was fed from the feed roll winding therearound the wired circuit board thus obtained and was wound up by the winding roll, together with the right-side spacer, the left-side spacer and the upper spacer. Thereafter, the wired circuit board wound up by the winding roll was heated at 400° C. in vacuum (10–50 Pa), with its being kept in its rolled state, whereby the polyamic acid resin layer was cured to be imidized so as to form the coverlay.

Comparative Example 1

Except that the upper spacer was not used and only the right-side spacer and the left-side spacer were wound together with the wired circuit board, the coverlay was formed on the wired circuit board in the same manner as in Example 1.

Comparative Example 2

Except that after the wired circuit board forming thereon the polyamic acid resin layer was fed from the feed roll and was passed through the heating furnace of 400° C. to cure the polyamic acid resin layer, so as to form the coverlay, the wired circuit board was wound up by the winding roll, the coverlay was formed on the wired circuit board in the same manner as in Example 1.

EVALUATION

The lengthwise and widthwise center distances between the sizing mark holes (number of test samples measured n=12) of the wired circuit boards obtained in Example 1 and Comparative Examples 1 and 2 were measured to find the rate of dimensional change (the proportion of deviation from the set dimension) and the standard deviation a for each of them. The measurement results are shown in TABLE 1 given below.

TABLE 1

| | Example and Comparative Example | | |
|---|---|---|---|
| | Example 1 | Comparative Example 1 | Comparative Example 2 |
| Rate of dimensional change (%) | | | |
| Lengthwise | −0.01 | −0.05 | 0.60 |
| Widthwise | −0.07 | −0.22 | −2.14 |
| Standard deviation σ | | | |
| Lengthwise | 0.005 | 0.021 | 0.18 |
| Widthwise | 0.009 | 0.047 | 0.51 |

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A method for manufacturing a wired circuit board comprising:

forming an uncured thermosetting resin layer on a wired circuit board having a specified wired circuit pattern formed on an elongate insulating film;

winding in layers the wired circuit board forming thereon the uncured thermosetting resin layer; and curing the uncured thermosetting resin layer by heating the wired circuit board wound in its rolled state, wherein in the winding step, first spacers are disposed on the wired circuit board at both widthwise ends thereof and a second spacer is disposed on the first spacers to extend between the first spacers so as to cover a widthwise area of the wired circuit board in such a manner that the first spacers and the second spacer are positioned between the layers of the wired circuit board when wound.

* * * * *